United States Patent
Hobson

(10) Patent No.: US 7,689,762 B2
(45) Date of Patent: Mar. 30, 2010

(54) STORAGE DEVICE WEAR LEVELING

(75) Inventor: Russell Hobson, Glasgow (GB)

(73) Assignee: ATMEL Corporation, San Jose, CA (US)

( * ) Notice: Subject to any disclaimer, the term of this patent is extended or adjusted under 35 U.S.C. 154(b) by 279 days.

(21) Appl. No.: 11/743,974

(22) Filed: May 3, 2007

(65) Prior Publication Data

US 2008/0276035 A1 Nov. 6, 2008

(51) Int. Cl.
*G06F 12/02* (2006.01)
(52) U.S. Cl. .................. 711/103; 711/165; 711/159
(58) Field of Classification Search .............. 711/165, 711/103, 159; 365/239
See application file for complete search history.

(56) References Cited

U.S. PATENT DOCUMENTS

| | | | |
|---|---|---|---|
| 5,404,485 A | 4/1995 | Ban | |
| 5,537,552 A * | 7/1996 | Ogasawara et al. | 710/57 |
| 5,930,815 A * | 7/1999 | Estakhri et al. | 711/103 |
| 5,937,425 A | 8/1999 | Ban | |
| 5,956,473 A | 9/1999 | Ma et al. | |
| 6,000,006 A | 12/1999 | Bruce et al. | |
| 6,016,275 A | 1/2000 | Han | |
| 6,092,160 A | 7/2000 | Marsters | |
| 6,427,186 B1 | 7/2002 | Lin et al. | |
| 6,725,321 B1 | 4/2004 | Sinclair et al. | |
| 6,732,221 B2 | 5/2004 | Ban | |
| 6,850,443 B2 | 2/2005 | Lofgren et al. | |
| 6,914,853 B2 | 7/2005 | Coulson | |
| 6,973,531 B1 | 12/2005 | Chang et al. | |
| 6,985,992 B1 | 1/2006 | Chang et al. | |
| 7,035,967 B2 | 4/2006 | Chang et al. | |
| 7,096,313 B1 | 8/2006 | Chang et al. | |
| 7,120,729 B2 | 10/2006 | Gonzalez et al. | |
| 7,139,863 B1 | 11/2006 | Defouw et al. | |
| 7,315,917 B2 * | 1/2008 | Bennett et al. | 711/103 |
| 2003/0033510 A1 | 2/2003 | Dice | |
| 2003/0065899 A1 * | 4/2003 | Gorobets | 711/165 |
| 2003/0163633 A1 * | 8/2003 | Aasheim et al. | 711/103 |
| 2003/0229753 A1 | 12/2003 | Hwang | |
| 2003/0229766 A1 | 12/2003 | Dice et al. | |
| 2004/0083335 A1 | 4/2004 | Gonzalez et al. | |
| 2004/0210706 A1 | 10/2004 | In et al. | |
| 2005/0047229 A1 | 3/2005 | Nadeau-Dostie et al. | |
| 2005/0055495 A1 * | 3/2005 | Vihmalo et al. | 711/103 |
| 2006/0106972 A1 * | 5/2006 | Gorobets et al. | 711/103 |
| 2006/0161724 A1 * | 7/2006 | Bennett et al. | 711/103 |
| 2006/0256623 A1 | 11/2006 | Roohparvar | |
| 2006/0288153 A1 | 12/2006 | Tanaka et al. | |
| 2007/0050536 A1 * | 3/2007 | Kolokowsky | 711/103 |
| 2007/0083698 A1 * | 4/2007 | Gonzalez et al. | 711/103 |
| 2007/0103992 A1 * | 5/2007 | Sakui et al. | 365/185.33 |
| 2007/0150644 A1 * | 6/2007 | Pinto et al. | 711/103 |
| 2007/0208904 A1 * | 9/2007 | Hsieh et al. | 711/103 |

* cited by examiner

*Primary Examiner*—Christian P Chace
*Assistant Examiner*—Sam Chen
(74) *Attorney, Agent, or Firm*—Fish & Richardson P.C.

(57) ABSTRACT

A reference memory location can be designated in a memory device. A memory location can be designated in response to storing data in the memory device. If the identified memory location is associated with the reference memory location then an allocated memory location can be designated relative to the reference memory location, and the allocated memory location can be leveled.

22 Claims, 7 Drawing Sheets

STORAGE DEVICE WEAR LEVELING

BACKGROUND

This disclosure relates to wear leveling.

The memory cells of a memory device, such as a flash memory device, can eventually wear out from repeated programming and erasure. To extend the overall life of a memory device, addressable sections of the memory device, such as blocks or pages, can be programmed and/or erased at similar rates by wear leveling. Wear leveling ensures that the memory cells of the memory device wear evenly, e.g., programming and/or erasing of memory cells occurs at a similar rate for all the memory cells over the life of the memory device. Wear leveling typically includes the swapping of data stored in memory locations that are infrequently changed with data stored in frequently changing memory locations, or the moving of data stored in memory blocks that are infrequently changed to unallocated memory blocks. The even wearing of the memory cells can thus prevent premature failure of the memory device.

SUMMARY

Disclosed herein are systems and methods of wear leveling. In one implementation, a reference memory location can be designated in a memory device, and a memory location can be identified in response to storing data in the memory device. If the identified memory location is associated with the reference memory location, then an allocated memory location relative to the reference memory location is identified, and the allocated memory location is leveled.

In another implementation, a determination can be made as to whether to level an allocated memory location that is relative in a designated reference memory location. If the allocated memory location is determined to be leveled, then an unallocated memory location relative to the allocated memory location can be allocated to store data stored in the allocated memory location, and the allocated memory location can be deallocated. The designated reference memory location can be redesignated relative to the deallocated memory.

In another implementation, a first allocated memory location relative to a reference memory location can be identified, and an unallocated memory location relative to the allocated memory location can also be identified. The unallocated memory location can be allocated to store data stored in the first allocated memory location, and the first allocated memory location can be deallocated. A memory location relative to the deallocated memory location can be identified, and the identified memory location can be designated as the reference memory location.

In another implementation, a memory device can comprise a memory array comprising memory cells defining memory blocks and a memory driver configured to define a leveling locator and a free block locator. The memory driver can also be configured to reference respective memory blocks indicated by the leveling locator and free block locator, and determine if the free block locator is associated with the leveling locator. Upon a positive determination, the memory driver can identify a utilized memory block respective to the leveling locator, and level the utilized memory block.

DETAILED DESCRIPTION

Figure 1:
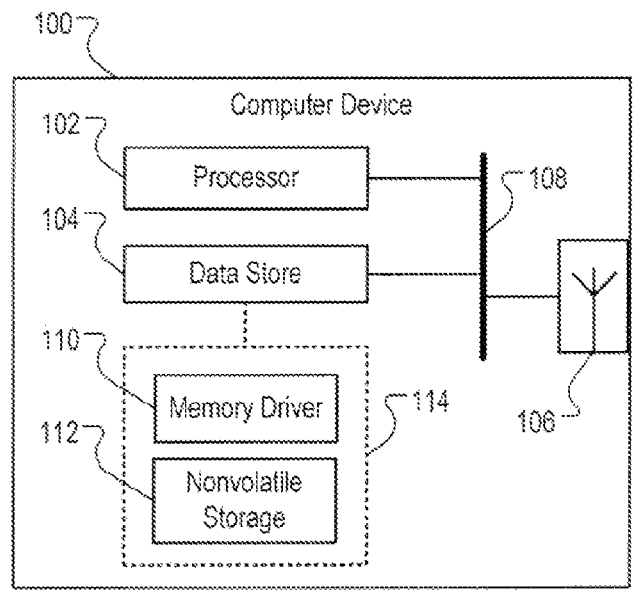
FIG. 1 is a block diagram of an example computer device.

FIG. 1 is a block diagram of an example computer system 100. The system 100 can include a processor 102, a data storage system 104, and a communication system 108. Each of the components 102, 104, and 108 can, for example, be connected by a system bus 108. The processor 102 can process instructions stored in the data storage system 104 or received over the communication system 108. Various different general purpose or special purpose computing system configurations can be implemented as the computer system 100, such as personal computers, server computers, handheld or laptop devices, portable communication devices, programmable consumer electronics, gaming systems, multimedia systems, etc.

The data storage system 104 can, for example, include a volatile memory device, such as a random access memory (RAM), and/or can include a non-volatile memory device, such as a read only memory (ROM) and/or a flash memory. Other volatile and non-volatile memory devices can also be used. The data storage system 104 can, for example, store an operating system and one or more application programs that can be executed by the processor 102, and data associated with the operating system and/or the application programs.

The communication system 106 can transmit and receive data over a wired or wireless communication link. The communication subsystem 106 can, for example, include communication devices that support one or more communication protocols, such as the Institute of Electrical and Electronics Engineer (IEEE) 802.x family of protocols (e.g., an Ethernet, a token ring, a wireless local area network, a wireless personal area network, etc.) or some other wired or wireless communication protocol.

The data storage system 104 can include a memory driver 110 and a non-volatile storage 112, e.g., a flash memory device. The memory driver 110 can, for example, include software and/or hardware to facilitate control of and access to the non-volatile storage 112. The memory driver 110 can, for example, utilize a logical-to-physical addressing translation for read and write operations. An example memory device architecture utilizing logical-to-physical mapping is shown and described with respect to FIG. 2 below.

In one implementation, the memory driver 110 and the non-volatile storage 112 can be integrated on the same substrate 114 or device. In another implementation, the memory driver 110 and the non-volatile storage 112 can be on separate substrates or devices, e.g., the memory driver 110 can be implemented in software and/or hardware within the computer system 100, and separate from the substrate or device implementing the non-volatile storage 112.

Figure 2:
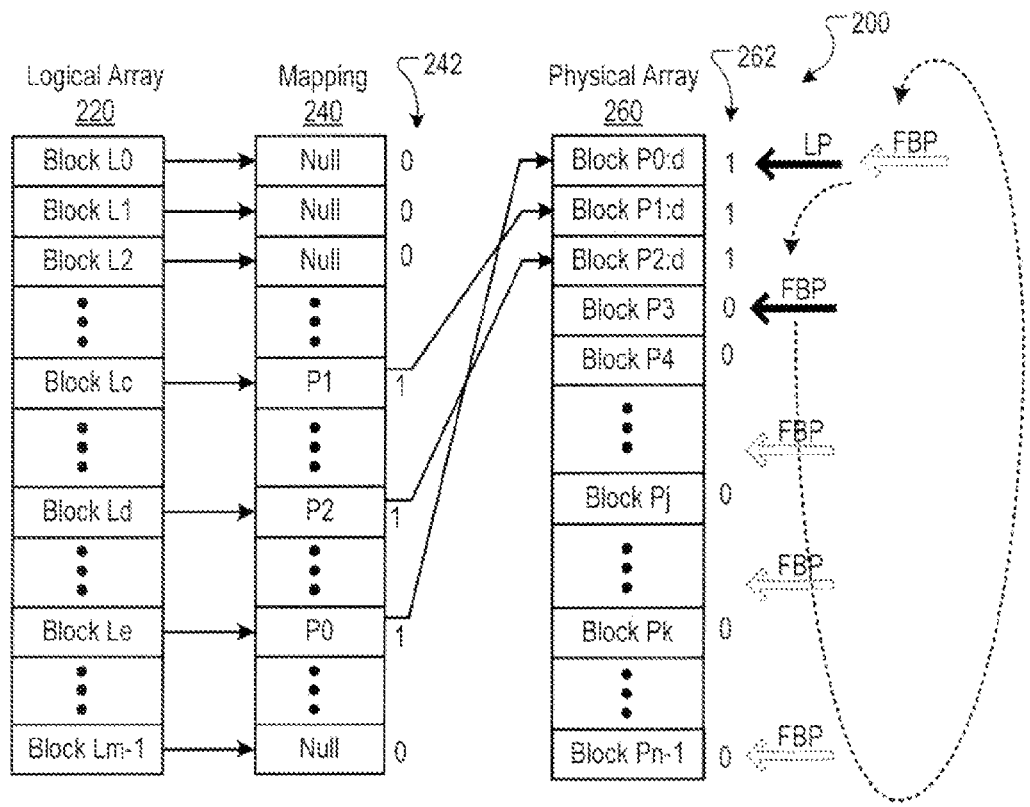
FIGS. 2-6 are diagrams of a memory device architecture implementing wear leveling.

FIG. 2 is a block diagram of a memory device architecture 200. The memory device architecture 200 can include a logical array 220, a logical-to-physical mapping array 240, and a physical array 260. The mapping array 240 can define a mapping of logical addresses defined by the logical array 220 to the physical addresses defined by the physical array 260. For example, the mapping array 240 can dynamically map m blocks of logical array 220 locations to n blocks of physical array 260 locations. In some implementation, each logical array 240 block, e.g. Block Lx, where x=0 . . . m−1, when allocated, corresponds to a mapped physical array block, e.g., Block Py, where y=0 . . . n−1. In some implementations, m<n to ensure that unallocated memory locations for wear leveling are available in the physical array 260. Other implementations in which m=n or m>n can also be used, however.

In one implementation, the physical array 260 can be realized by a non-volatile memory device, e.g., a flash memory device. Other memory devices can also be used, however.

The mapping array 240 and the physical array 260 can have associated memory allocation flags 242 and 262, respectively. The memory allocation flags 242 and 262 can indicate, for example, whether the contents of each block associated with each memory allocation flag are valid, e.g., a currently allocated block for stored data, or invalid, e.g., a currently unallocated block that may contain expired data, erased data, or may otherwise be identified as an unallocated block of memory. For example, as shown in FIG. 2, the logical array 220 is currently defining stored data in at least three addresses, e.g., blocks Lc, Ld and Le. The logical array 220 blocks Lc, Ld and Le are mapped to corresponding physical array 260 blocks P0, P1 and P2, as defined by the mapping array 240. Each of the physical array 260 blocks P0. P1 and P2 store data represented by the abstracted data symbol d.

The memory cells of a physical array 260 can eventually wear out from repeated programming and erasure. Additionally, some blocks of the physical array 260 may not be programmed or erased very often, and thus other blocks of the physical array 260 are programmed and erased more often. To extend the overall life the physical array 260, the blocks P0 . . . Pn−1 can be programmed and/or erased at similar rates by wear leveling. Wear leveling ensures that the blocks P0, . . . Pn−1 wear evenly, e.g., programming and/or erasing of the blocks P0 . . . Pn−1 occurs at a similar rate for all the blocks over the lifetime of the physical array 260.

In an implementation, a reference memory location can be designated in the physical array 260. The reference memory location can be designated by, for example, a leveling pointer LP that stores the location of the reference memory location, e.g. the address P0 of block P0. Another identified memory location, e.g., a memory location currently eligible to receive data for storage, such as an unallocated memory location, can be designated in the physical array 260. The identified memory location can, for example, be designated by a free block pointer FBP that stores the address of the identified memory location. Upon a memory device initialization, e.g., a clearing of an entire flash memory, for example, the leveling pointer LP and the free block pointer FBP can reference the same memory location, e.g., block P0 in the physical array 260.

When data are stored in the physical array 260, the data are stored beginning at the memory block referenced by the free block pointer FBP. After the data are stored, the free block pointer FBP is incremented to identify the next memory location eligible to receive data for storage. For example, as shown in FIG. 2, after an initialization, data d are written to logical addresses defined by address blocks Lc, Ld and Le in the logical array 220. A first write operation stores data at the logical address Le; because the free block pointer FBP references memory block P0 in the physical array for the first write operation, the data are stored in the physical array at block P0, as indicated by the label "Block P0:d." The mapping table 240 stores the address of block P0 in a table entry associated with the logical address Le, and the corresponding memory allocation flags 242 and 262 for the mapping table 240 and the physical array 260 are set to 1, respectively. The free block pointer FBP can be incremented to the next available memory block in the physical array 260, e.g., block P1.

After several more write operations, e.g., writes to logical addresses Lc and Ld, respectively, the free block pointer FBP references the memory block P3 in the physical array 260. The process continues for each subsequent write operation, and the free block pointer FBP is incremented through the physical array 260. Eventually the free block pointer FBP traverses the entire physical array 260, at which time the free block pointer FBP and the leveling pointer LP reference the same memory location, e.g., block P0 in the physical array 260.

In some implementations, after each increment of the free block pointer FBP, a process determines if the identified memory location referenced by the free block pointer FBP is associated with the reference memory location referenced by the leveling pointer LP. For example, a process can determine whether the free block pointer FBP is equal to or has incremented past the leveling pointer LP. The determination can be made, for example, by a hardware and/or software logic implementation on a memory device defining the physical array 260, e.g., a control circuit on a flash card, or can be made by an external device, such as a hardware and/or software logic implementation in a memory driver device.

Figure 3:
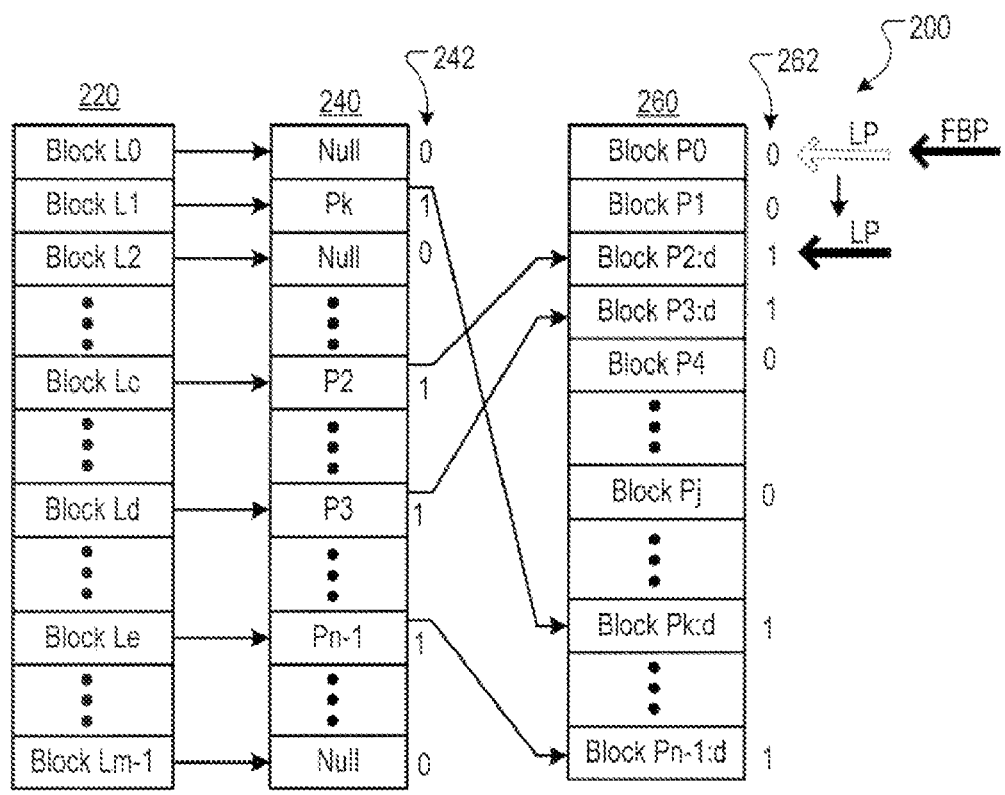

For example, as shown in FIG. 3, the free block pointer has been incremented n times and thus now stores the address of the first block P0 in the physical array 260, e.g., after the $n^{th}$ memory block write to the physical array 260 after initialization, the stored address in the free block pointer FBP rolls over to the initial address P0 of the physical array 260. Note, however, that after the $n^{th}$ memory block write to the physical array 260, the physical array 260 may have unallocated memory blocks. For example, the $n^{th}$ write to the physical array 260 is related to the storing of data in the logical address Le. As shown in FIG. 2, the logical address Le was initially mapped to the memory block P0 in the physical array 260; however, the $n^{th}$ write resulted in the logical address Le being mapped to the memory block Pn−1 in the physical array 260. Accordingly, the block P0 is deallocated as the data stored in block P0 is no longer mapped to a logical address. The deallocated status of the memory block P0 is indicated by the corresponding memory allocation flag 262 being set to 0.

In some implementations, if the identified memory location referenced by the free block pointer FBP is associated with the reference memory location referenced by the leveling pointer LP, a wear leveling operation can be performed. In one implementation, wear leveling includes identifying an allocated memory location relative to the reference memory location. For example, as shown in FIG. 3, an allocated memory location can be identified by incrementing the leveling pointer LP through the physical array 260 until a memory block having a set allocation flag 260 is identified. Accordingly, the leveling pointer LP in FIG. 3 increments from the reference memory location block P0 to block P2, which is the first allocated memory location relative to the reference memory location P0.

Figure 4:
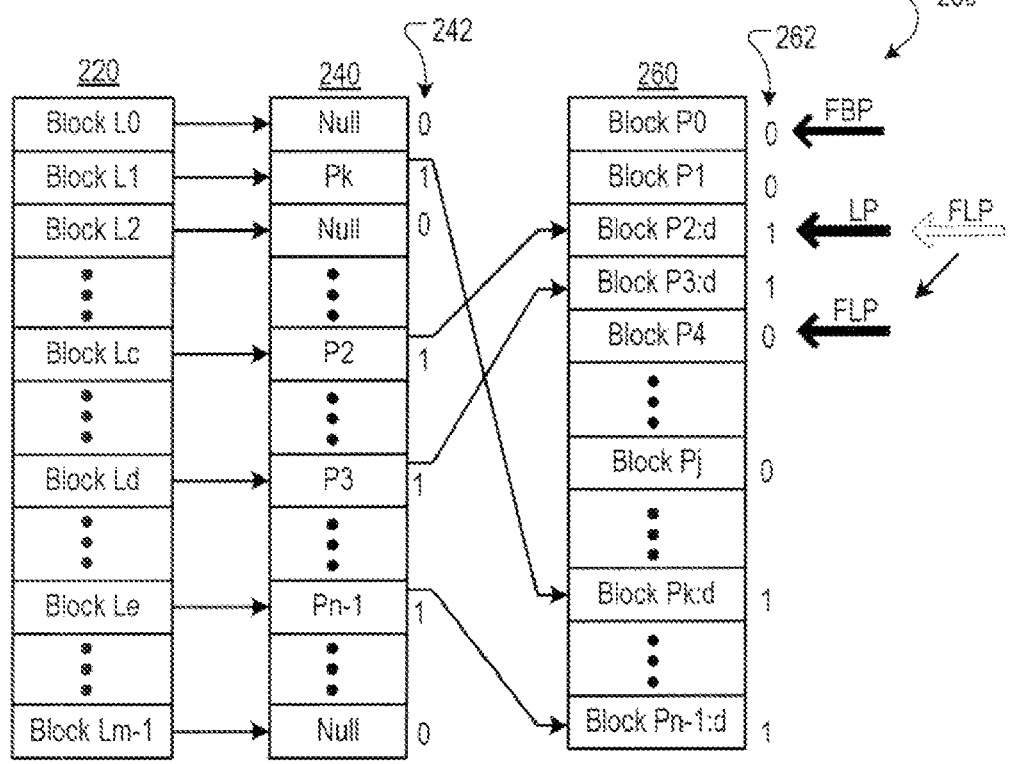

An unallocated memory location can then be designated to store the data stored in the allocated memory location. In some implementations, another pointer can be instantiated to identify the unallocated memory location. For example, as shown in FIG. 4, a free leveling pointer FLP is instantiated and set equal to the leveling pointer LP. The free leveling pointer FLP is then incremented through the physical array 260 until a memory block having a cleared allocation flag 260 is identified. Accordingly, the free leveling pointer FLP in FIG. 4 increments from the allocated memory location block P2 to block P4, which is the first unallocated memory location relative to the allocated memory location P2.

Figure 5:
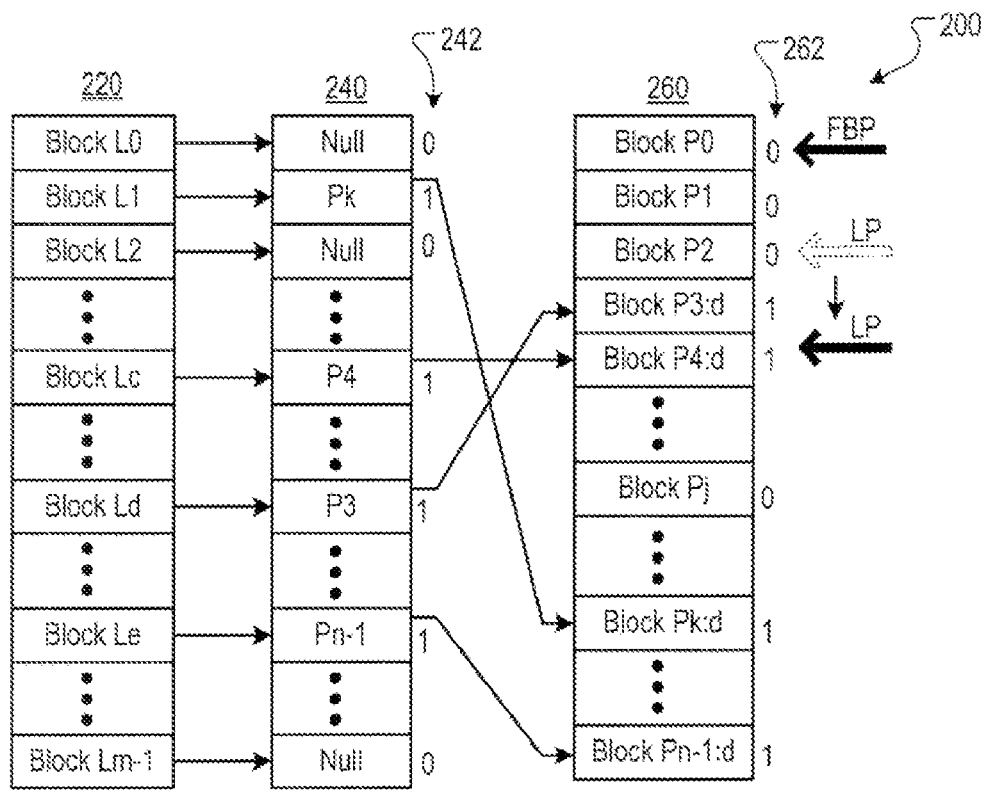

The leveling pointer LP and the free leveling pointer FLP thus identify a memory block to be leveled, e.g., block P2, and the destination, e.g., block P4, of the data presently stored in the block to be leveled. FIG. 5 depicts the mapping after the data stored in the memory block P2 of the physical array 260 is moved to the memory block P4. As a result of the movement of the data, the allocation flag 262 for the memory block P2 is cleared, and the allocation flag 262 for the memory block P4 is set. Additionally, the mapping of the logical block Lc in the mapping array 240 is updated with the address of the logical block P4.

In one implementation, after the data stored in the allocated memory location, e.g., memory block P2, is moved to the unallocated memory location, e.g., memory block P4, the leveling pointer LP can be set to the value of the free leveling pointer FLP, as indicated in FIG. 5, and the free leveling pointer FLP can be deallocated. The leveling pointer LP, however, can also be set to other values. For example, in one implementation, the leveling point LP can be set to the first unallocated memory location that occurs after the memory location referenced by the free leveling pointer FLP; in another implementation, the leveling point LP can remain set to the previously allocated memory location, e.g., block P2 in FIG. 5; or can be set to some other value.

Once the wear leveling process is complete, the system can continue writing logical and physical blocks as previously described. In some implementations, another leveling operation will occur when the free block pointer FBP is equal to or increments past the leveling pointer LP a second subsequent time, as it is likely that the free block pointer FBP value is not far behind the leveling pointer LP value after a wear leveling operation, and thus may be equal again after a relatively small number of write operations.

In some implementations, the free block pointer FBP can be set to the first unallocated memory location after the memory location reference by the leveling pointer LP. Accordingly, a wear leveling may occur when the free block pointer FBP is again equal to or increments past the leveling pointer LP.

In some implementations, each time the value of the free block pointer FBP is equal to or increments past the value of the leveling pointer LP, a process can determine whether a wear leveling operation is to be performed. The determination can be made, for example, by a hardware and/or software logic implementation on a memory device defining the physical array 260, e.g., a control circuit on a flash card, or can be made by an external device, such as a hardware and/or software logic implementation in a memory driver device.

In one implementation, the occurrence of a wear leveling condition can invoke a wear leveling operation. For example, in one implementation, a wear leveling condition can occur each time the free block pointer FBP value is equal to or increments past the leveling pointer LP value; in another implementation, a wear leveling condition can occur every $m^{th}$ time the free block pointer FBP value is equal to or increments past the leveling pointer LP value.

Other wear leveling conditions can also be used, such as delaying execution of the wear leveling process until a time during which a user process may not demand processing resources, e.g., during a shut down or start up process; etc. In one implementation, if the leveling pointer LP and the free block pointer FBP are equal, an operating system can mark the memory blocks for swapping and reserve the memory blocks until the leveling process is performed. In another implementation, if the leveling pointer LP and the free block pointer FBP are equal, an operating system can mark the memory blocks for swapping; however, if the memory blocks marked for leveling have been moved or are flagged an unallocated before the leveling process starts, the leveling process can be cancelled.

In some implementations, the leveling pointer LP and the free leveling pointer FLP can be combined as a single pointer. Other memory block allocation and deallocation resources can also be used, e.g., another table, such as an allocation table, can be used instead of the pointers and allocation flags described above.

Figure 6:
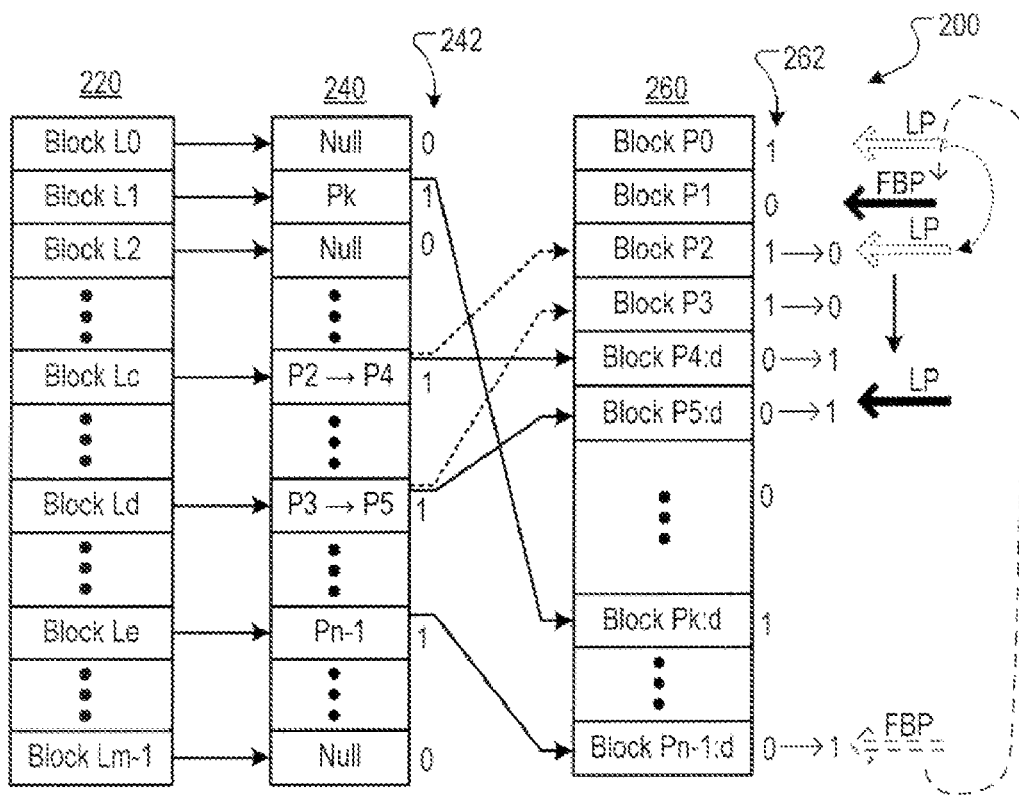

Other leveling implementations can also be used. For example, several blocks of memory can be leveled during a leveling operation. As shown in FIG. 6, the free block pointer FBP initially references the last memory block Pn−1 in the physical array 260 after a write operation is performed and data are stored in the physical array 260 memory block Pn−1, the free block pointer FBP is incremented to the next unallocated memory block, e.g., memory block P1, and thus increments past the leveling pointer LP, triggering a leveling operation. The leveling operation of FIG. 6, however, moves a contiguous blocks of memory locations, e.g., the memory locations P2 and P3, to two unallocated memory locations, e.g., memory blocks P4 and P5.

In some implementations, several non-contiguous blocks of memory can be leveled during a leveling operation, e.g., the next q block of allocated memory can be wear leveled, etc. In some implementations, particular memory blocks can be exempt from wear leveling, e.g., memory block that are identified as failed blocks; or memory block P0, which can be used as a fixed location for system data.

Figure 7:
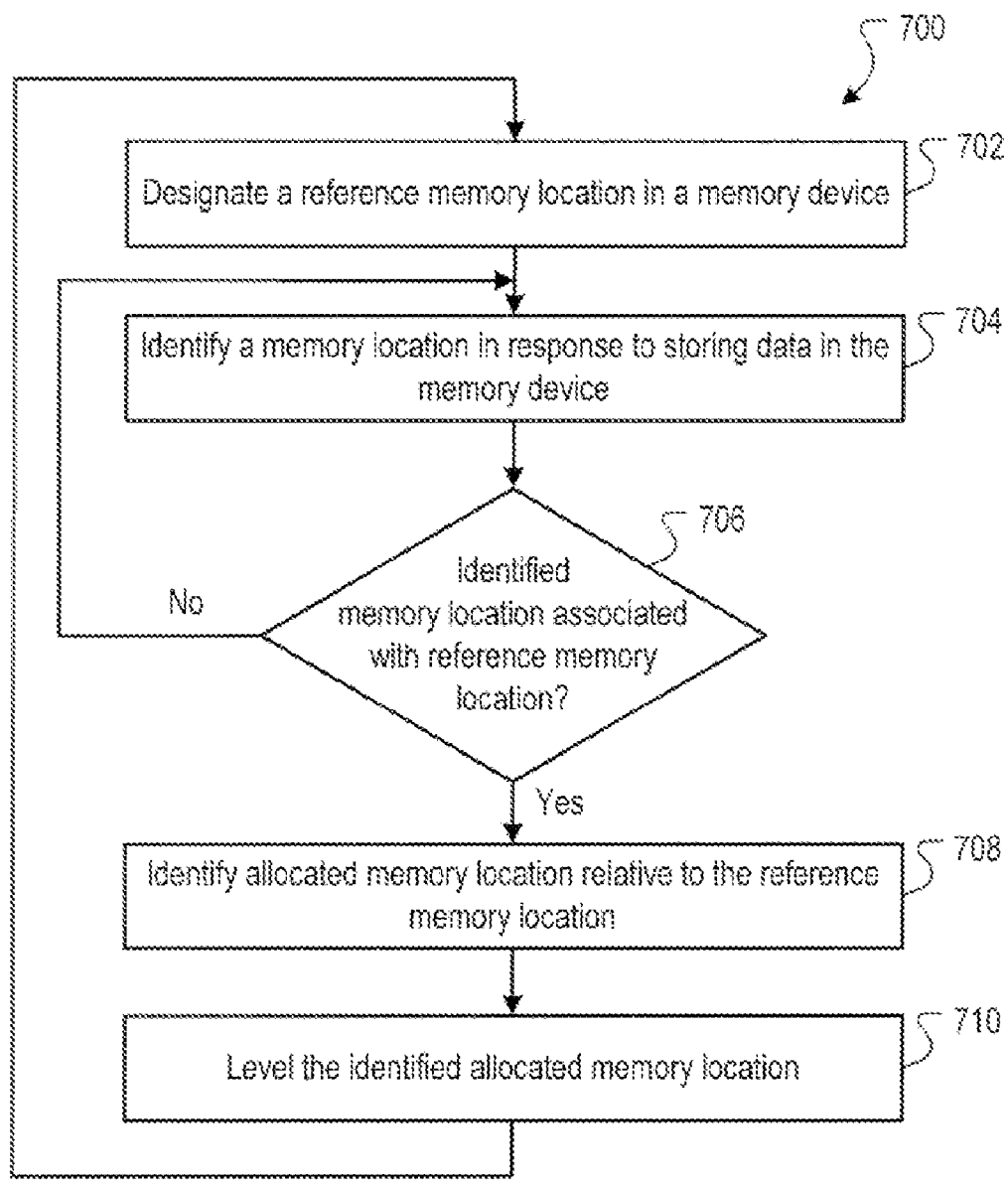
FIG. 7 is a flow diagram of an example process for wear leveling.

FIG. 7 is a flow diagram of an example process 700 of wear leveling. The example process 700 can, for example, be implemented in the non-volatile storage 112, or in a memory driver 110 associated with the non-volatile store 112, or in some other hardware and/or software memory resource.

Stage 702 designates a reference memory location in a memory device. For example, the non-volatile storage 112, or a memory driver 110 associated with the non-volatile store 112 can associate a leveling pointer LP with a memory location to designate the memory location as a reference memory location.

Stage 704 identifies a memory location in response to storing data in the memory device. For example, the non-volatile storage 112, or a memory driver 110 associated with the non-volatile store 112 can associate a free block pointer FBP with a memory location in response to storing data in a memory device.

Stage 706 determines if the identified memory location is associated with the reference memory location. For example, the non-volatile storage 112, or a memory driver 110 associated with the non-volatile store 112 can determine if the free block pointer FBP is equal to or has incremented past the leveling pointer LP.

If stage 706 determines that the identified memory location is not associated with the reference memory location, the process returns to stage 704. If, however, stage 706 determines that the identified memory location is associated with the reference memory location, then stage 708 identifies an allocated memory location relative to the reference memory location. For example, the non-volatile storage 112, or a memory driver 110 associated with the non-volatile store 112 can increment the leveling pointer LP to a first allocated memory location, e.g., the memory block P2 of FIG. 3, for example.

Stage 710 levels the allocated memory location. For example, the non-volatile storage 112, or memory driver 110 associated with the non-volatile storage 112 can move the data stored in the first allocated memory location.

Figure 8:
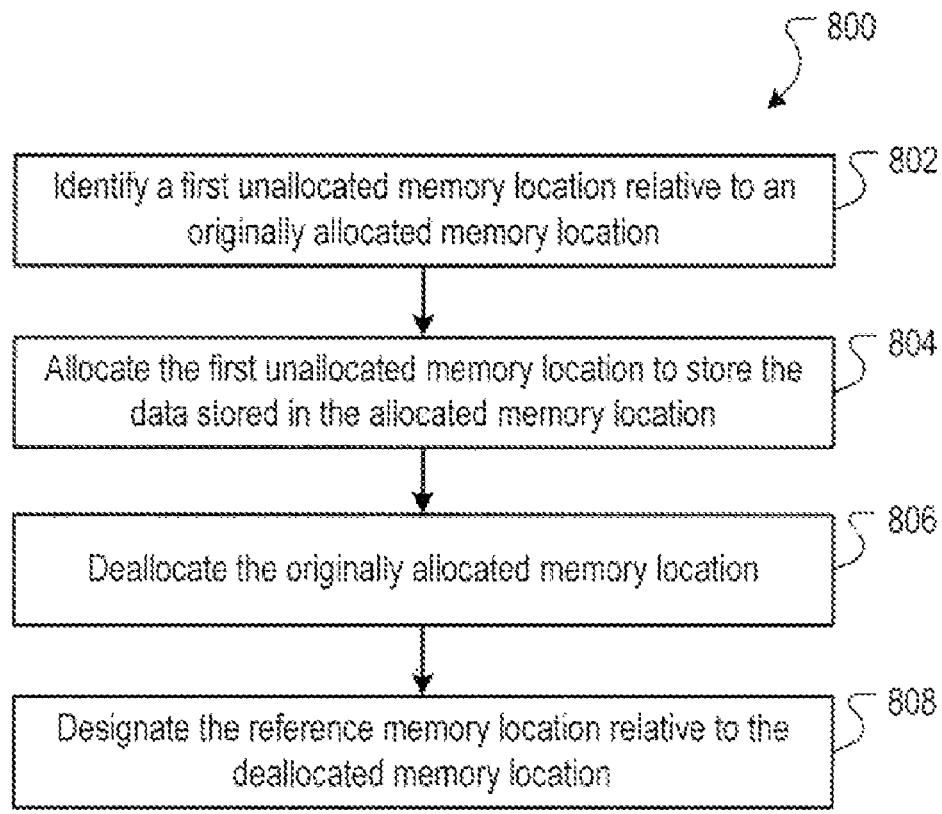
FIG. 8 is a flow diagram of an example process for leveling allocated memory.

FIG. 8 is a flow diagram of an example process 800 of leveling allocated memory. The example process 800 can, for example, be implemented in the non-volatile storage 112, or in a memory driver 110 associated with the non-volatile store 112, or in some other hardware and/or software memory resource.

Stage 802 identifies a first unallocated memory location relative to an originally allocated memory location. For example, the non-volatile storage 112, or a memory driver 110 associated with the non-volatile store 112 can increment a free leveling pointer FLP from the address of the leveling pointer LP to identify an unallocated memory location.

Stage 804 allocates the first unallocated memory location to store the data stored in the originally allocated memory location. For example, the non-volatile storage 112, or a memory driver 110 associated with the non-volatile store 112 can store data in the unallocated memory location pointed to by the free leveling pointer and set the corresponding allocation flag 282 to 1, i.e., the data stored in the originally allocated memory location can be moved to an unallocated memory location, and the state of the unallocated memory location can thus be changed to an allocated memory location.

Stage 806 deallocates the originally allocated memory location. For example, the non-volatile storage 112, or a memory driver 110 associated with the non-volatile store 112 can set the corresponding allocation flag of the originally allocated memory location from which data was moved during the leveling process to 0, thus deallocating the originally allocated memory location.

Stage 808 designates the reference memory location relative to the deallocated memory location. For example, the non-volatile storage 112, or a memory driver 110 associated with the non-volatile store 112 can increment the leveling pointer LP from the deallocated memory location to another memory location.

Figure 9:
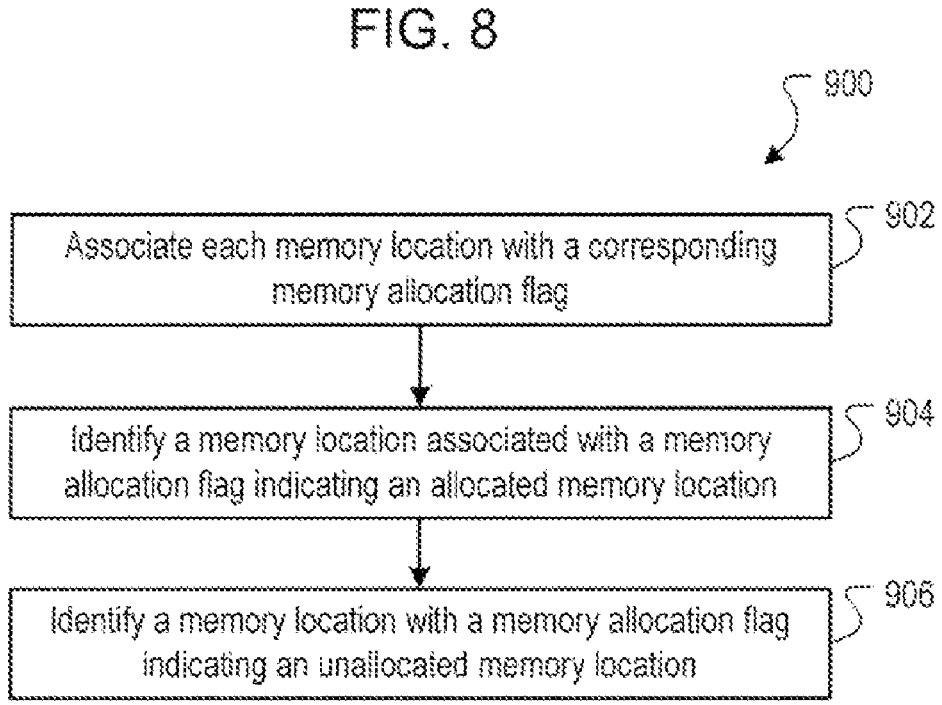
FIG. 9 is a flow diagram of an example process for identifying memory locations for wear leveling.

FIG. 9 is a flow diagram of an example process 900 for identifying memory locations for wear leveling. The example process 900 can, for example, be implemented in the non-volatile storage 112, or in a memory driver 110 associated with the non-volatile store 112, or in some other hardware and/or software memory resource.

Stage 902 associates each memory location with a corresponding memory allocating flag. For example, the non-volatile storage 112, or a memory driver 110 associated with the non-volatile store 112 can associated each memory location in the physical array 260 with memory allocation flags 262.

Stage 904 identifies a memory location associated with a memory allocation flag indicating an allocated memory location. For example, the non-volatile storage 112, or a memory driver 110 associated with the non-volatile store 112 can identify a memory location with an allocation flag 262 set to 1 and set the leveling point LP equal to the address of the identified memory location.

Stage 906 identifies a memory location associated with a memory allocation flag indicating an unallocated memory location. For example, the non-volatile storage 112, or a memory driver 110 associated with the non-volatile store 112 can identify a memory location with an allocation flag 262 set to 0 and set the free leveling point FLP equal to the address of the identified memory location.

Figure 10:
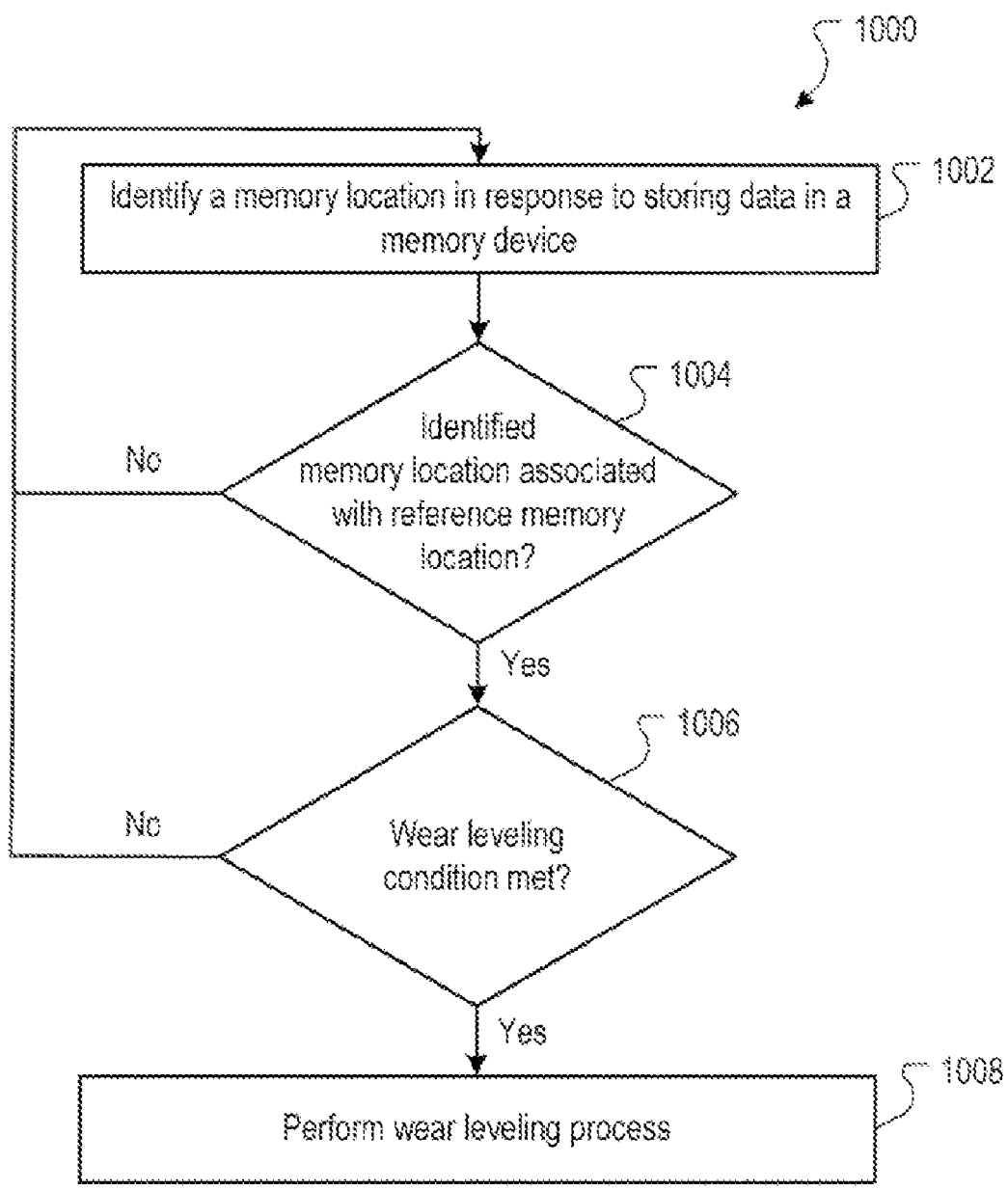
FIG. 10 is a flow diagram of an example process for determining whether to wear level a memory location.

FIG. 10 is a flow diagram of an example process 1000 for determining whether to wear level a memory location. The example process 1000 can, for example, be implemented in the non-volatile storage 112, or in a memory driver 110 associated with the non-volatile store 112, or in some other hardware and/or software memory resource.

Stage 1002 identifies a memory location in response to storing data in a memory device. For example, the non-volatile storage 112, or a memory driver 110 associated with the non-volatile store 112 can associate a free block pointer with a memory location in response to storing data in a memory device.

Stage 1004 determines whether the identified memory location is associated with a reference memory location. For example, the non-volatile storage 112, or a memory driver 110 associated with the non-volatile store 112 can determine if the free block pointer FBP is equal to or has incremented past the leveling pointer LP.

If stage 1004 determines that the identified memory location is not associated with a reference memory location, the process returns to stage 1002. If, however, stage 1004 determines that the identified memory location is associated with a reference memory location, then stage 1006 determines whether a wear leveling condition is met. For example, the non-volatile storage 112, or a memory driver 110 associated with the non-volatile store 112 can determine if one or more of the wear leveling conditions described above has occurred.

If stage 1006 determines that a wear leveling condition is not met, then the process returns to stage 1002. If, however, stage 1006 determines a wear leveling condition is met, then stage 1008 performs a wear leveling process. For example, the non-volatile storage 112, or a memory driver 110 associated with the non-volatile store 112 can perform one of the wear leveling processed described above.

Figure 11:
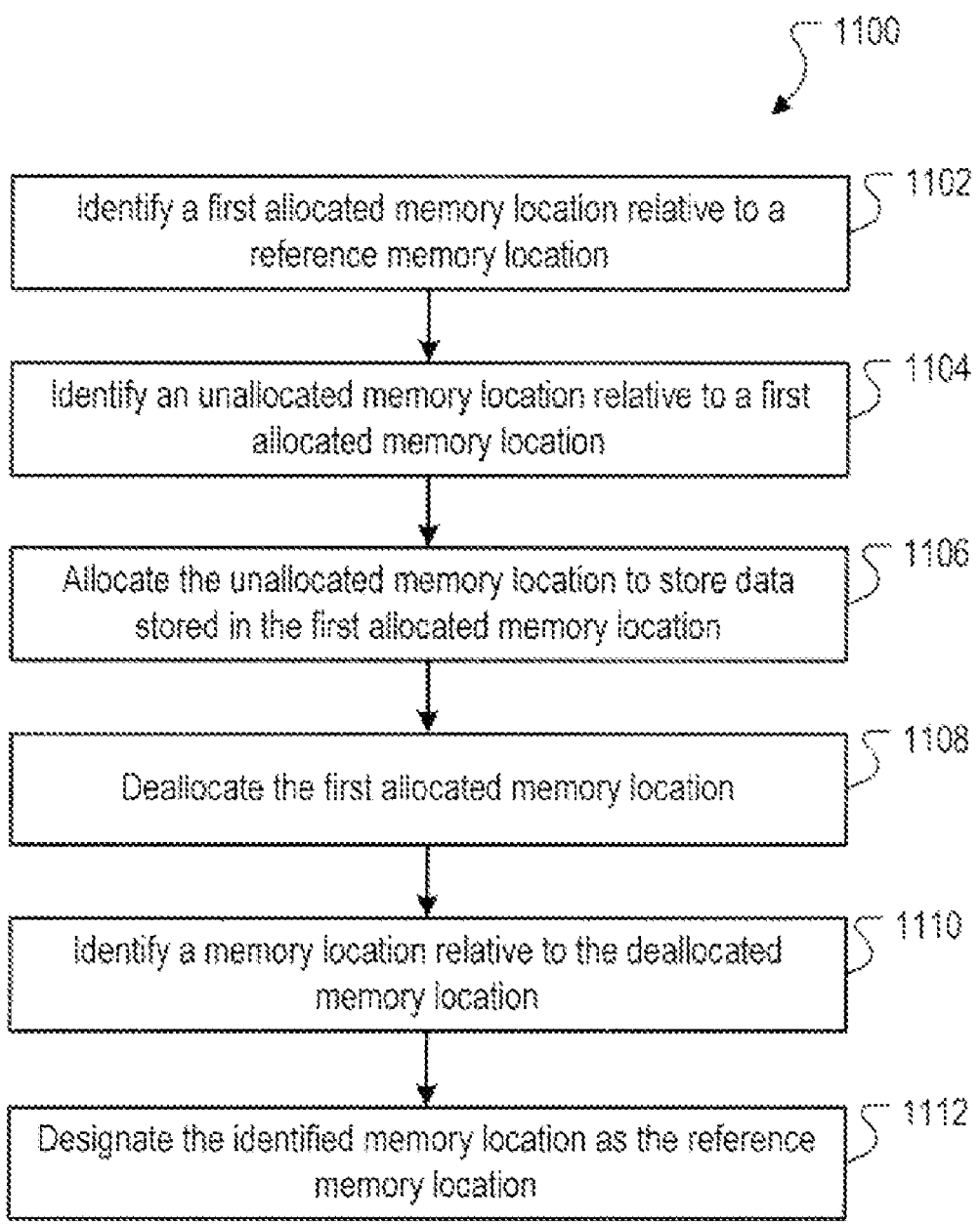
FIG. 11 is a flow diagram of another example process of wear leveling.

FIG. 11 is a flow diagram of an example process 1100 of wear leveling. The example process 1000 can, for example, be implemented in the non-volatile storage 112, or in a memory driver 110 associated with the non-volatile store 112, or in some other hardware and/or software memory resource.

Stage 1102 identifies a first allocated memory location relative to a reference memory location. For example, the non-volatile storage 112, or a memory driver 110 associated with the non-volatile store 112 can increment a leveling pointer LP from the current address of the leveling pointer LP to identify an allocated memory location.

Stage 1104 identifies an unallocated memory location relative to a first allocated memory location. For example, the non-volatile storage 112, or a memory driver 110 associated with the non-volatile store 112 can increment a free leveling pointer FLP from the current address of the incremented leveling pointer LP to identify an unallocated memory location.

Stage 1106 allocates the unallocated memory location to store data stored in the first allocated memory location. For example, the non-volatile storage 112, or a memory driver 110 associated with the non-volatile store 112 can store data in the unallocated memory location pointed to by the free leveling pointer and set the corresponding allocation flag 262 to 1.

Stage 1108 deallocates the first allocated memory location. For example, the non-volatile storage 112, or a memory driver 110 associated with the non-volatile store 112 can set the corresponding allocation flag of the memory location from which data was moved during the leveling process to 0.

Stage 1110 identifies a memory location relative to the deallocated memory location. For example, the non-volatile storage 112, or a memory driver 110 associated with the non-volatile store 112 can identify the memory location referenced by the free leveling pointer FLP or a first unallocated memory location incremented from the address of the free leveling pointer FLP.

Stage 1112 designates the identified memory location as the reference memory location. For example, the non-volatile storage 112, or a memory driver 110 associated with the non-volatile store 112 can set the leveling pointer LP to the address of the memory location identified in stage 1110.

FIGS. 2-11 above describe leveling at the block level. For memory devices in which writing operations are made on a page basis, the mapping table 240 and the pointers can be updated when the writing operation increments onto the next physical block. Similarly, the processes above can be adapted to any memory architecture that includes a sequential addressing scheme.

The apparatus, methods, flow diagrams, and structure block diagrams described in this patent document may be implemented in computer processing systems including program code comprising program instructions that are executable by the computer processing system. Other implementations may also be used. Additionally, the flow diagrams and structure block diagrams described in this patent document, which describe particular methods and/or corresponding acts in support of steps and corresponding functions in support of disclosed structural means, may also be utilized to implement corresponding software structures and algorithms, and equivalents thereof.

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

What is claimed is:

1. A method, comprising:
   designating a reference memory location at a first physical memory address in a memory device;
   designating a target memory location at a second physical memory address in the memory device, the target memory location being designated for storing data in the memory device;
   in response to data being stored to the target memory location, incrementing the second physical memory address for the target memory location;
   determining that the second physical memory address for the target memory location has been incremented to the first physical memory address for the reference memory location; and
   in response to determining that the second physical memory address for the target memory location has been incremented to the first physical memory address for the reference memory location:
      incrementing the first physical memory address for the reference memory location when the first physical memory address is not mapped to a logical address; and
      leveling the reference memory location referenced by the first physical memory address when the first memory location is mapped to a logical address.

2. The method of claim 1, wherein leveling the first physical memory address for the reference memory location comprises:
   identifying a first unallocated memory location having a nearest incremental physical memory address relative to the first physical memory address for the reference memory location;
   allocating the first unallocated memory location to store data stored in the reference memory location; and
   deallocating the reference memory location.

3. The method of claim 2, further comprising designating the reference memory location at a first allocated physical memory address relative to a physical memory address for the deallocated reference memory location.

4. The method of claim 1, wherein determining that the second physical memory address for the target memory location has been incremented to the first physical memory address for the reference memory location comprises determining that the second physical address for the target memory location is equal to the first physical memory address for the reference memory location.

5. The method of claim 1, wherein the memory device comprises a flash memory device.

6. The method of claim 3, wherein designating the reference memory location at the first allocated physical memory address relative to the physical memory address for the deallocated reference memory location comprises designating the reference memory location at a next sequential allocated physical memory address relative to the physical memory address of the deallocated reference memory location.

7. The method of claim 3, wherein designating the reference memory location at a first allocated physical memory address relative to the deallocated reference memory location comprises designating the reference memory location at a next sequential unallocated physical memory location relative to the physical memory address of the deallocated reference memory location.

8. The method of claim 2, further comprising associating memory locations with corresponding memory allocation flags, each allocation flag indicative of whether the memory location corresponding to allocation flag is mapped to a logical address.

9. The method of claim 8, wherein incrementing the first physical memory address for the reference memory location when the first memory address is not mapped to a logical address comprises incrementing the first physical memory address for the reference memory location to a physical memory address for a memory location having a memory allocation flag indicating that the memory location is mapped to a logical address.

10. The method of claim 1, wherein incrementing the first physical memory address for the reference memory location comprises incrementing a leveling pointer that references the first physical memory address for the reference memory location.

11. The method of claim 10, wherein leveling the reference memory location comprises:
   leveling the reference memory location and each allocated memory location having a physical address included in a range of physical memory addresses between the physical memory address referenced by the leveling pointer and a free-leveling-pointer referencing a physical address of a last consecutive allocated memory location relative to the reference memory location.

12. A method, comprising:
   identifying, by a data processing device, a contiguous block of allocated memory locations to level based on a target memory location matching a reference memory location and the reference memory location being mapped to a logical address, the block of allocated memory locations including the reference memory location and at least one contiguous allocated memory location adjacent to the reference memory location;

allocating, by the data processing device, data stored in the identified contiguous block of allocated memory locations to unallocated memory locations;

deallocating, by the data processing device, the contiguous block of allocated memory locations; and redesignating, by the data processing device, the reference memory location at a highest physical memory address to which the data stored in the contiguous block of allocated memory locations is allocated.

13. A method, comprising:

determining, by a data processing device, that a free block pointer is incremented to a memory location being referenced by a leveling pointer, the free block pointer being a pointer for referencing a memory location that is eligible to receive data, the leveling pointer referencing a reference memory location;

identifying, by the data processing device, a first allocated memory location having a nearest incremental physical memory address relative to a physical memory address for the reference memory location;

identifying, by the data processing device, an unallocated memory location having an incremental physical memory address relative to the physical memory address that references the first allocated memory location;

storing data stored in the first allocated memory location at the unallocated memory location;

deallocating, by the data processing device, the first allocated memory location;

identifying, by the data processing device, a second memory location having a physical memory address that is within a specified range of the deallocated memory location; and designating, by the data processing device, the identified second memory location as the reference memory location.

14. The method of claim 13, wherein identifying a memory location having a physical memory address that is within a specified range of the deallocated memory location comprises identifying an unallocated memory location having the physical memory address of the deallocated memory location.

15. The method of claim 13, wherein identifying a memory location having a physical memory address that is within a specified range of the deallocated memory location comprises identifying an allocated memory location having a physical memory address that is within a specified range of the deallocated memory location.

16. A memory device, comprising:

a memory array comprising memory cells defining memory blocks; and a memory control circuit configured to:

define a leveling locator and a free block locator;

reference respective memory blocks indicated by the leveling locator and free block locator;

determine that the free block locator has been incremented to a memory block referenced by the leveling locator; and in response to determining that the free block locator has been incremented to a memory block referenced by the leveling locator, level a utilized memory block having a physical memory address that is within a threshold range of a physical memory address of a memory block referenced by the leveling locator.

17. The memory device of claim 16, wherein the memory control circuit is configured to:

define a free leveling locator respective to the utilized memory block; and allocate the memory block referenced by the free leveling locator to store data stored in the utilized memory block; and deallocate the memory block referenced by the utilized memory block.

18. The memory device of claim 17, wherein the memory control circuit is configured to:

redefine the leveling locator to reference a memory block within a specified physical address range of the deallocated memory block.

19. The memory device of claim 16, wherein each memory cell has a corresponding memory allocation flag.

20. The memory device of claim 16, wherein the memory device comprises a flash memory.

21. The memory device of claim 16, wherein the memory array and the memory control circuit are on a same substrate.

22. A system, comprising:

means for determining that a free block pointer is incremented to a memory location being referenced by a leveling pointer, the free block pointer being a pointer for referencing a memory location that is eligible to receive data, the leveling pointer referencing a reference memory location;

means for identifying a first allocated memory location at a nearest incremental physical memory address relative to the reference memory location;

means for identifying an unallocated memory location at a nearest incremental physical memory address relative to a first allocated memory location;

means for allocating the unallocated memory location to store data stored in the first allocated memory location;

means for deallocating the first allocated memory location; and means for identifying a second memory location having a physical memory address that is within a specified range of the deallocated memory location; and means for designating the second identified memory location as the reference memory location.

* * * * *

UNITED STATES PATENT AND TRADEMARK OFFICE
CERTIFICATE OF CORRECTION

PATENT NO. : 7,689,762 B2 Page 1 of 1
APPLICATION NO. : 11/743974
DATED : March 30, 2010
INVENTOR(S) : Russell Hobson It is certified that error appears in the above-identified patent and that said Letters Patent is hereby corrected as shown below:

Column 1, line 35, please delete "in" and insert -- to --

Column 2, line 18, please delete "108" and insert -- 106 --

Column 2, line 19, please delete "108" and insert -- 106 --

Column 2, line 22, please delete "108" and insert -- 106 --

Column 3, line 28, please delete "P0." and insert -- P0, --

Column 3, line 37, please delete "P0," and insert -- P0 --

Column 7, line 5, after "or" insert -- a --

Column 7, line 7, delete "location." and insert -- location to an unallocated memory location. --

Column 7, line 26, delete "282" and insert -- 262 --

Signed and Sealed this

Twenty-fifth Day of May, 2010

David J. Kappos
*Director of the United States Patent and Trademark Office*